United States Patent
Kubo

(10) Patent No.: US 10,103,003 B2
(45) Date of Patent: Oct. 16, 2018

(54) CHARGED PARTICLE BEAM DEVICE AND SAMPLE OBSERVATION METHOD IN CHARGED PARTICLE BEAM DEVICE

(71) Applicant: Hitachi High-Technologies Corporation, Minato-ku, Tokyo (JP)

(72) Inventor: Takashi Kubo, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/558,482

(22) PCT Filed: Mar. 25, 2015

(86) PCT No.: PCT/JP2015/059186
§ 371 (c)(1),
(2) Date: Sep. 14, 2017

(87) PCT Pub. No.: WO2016/151809
PCT Pub. Date: Sep. 29, 2016

(65) Prior Publication Data
US 2018/0068826 A1    Mar. 8, 2018

(51) Int. Cl.
*H01J 37/10* (2006.01)
*H01J 37/22* (2006.01)
(Continued)

(52) U.S. Cl.
CPC ............ *H01J 37/222* (2013.01); *H01J 37/10* (2013.01); *H01J 37/147* (2013.01); *H01J 37/244* (2013.01); *H01J 37/26* (2013.01)

(58) Field of Classification Search
CPC ........ H01J 37/222; H01J 37/10; H01J 37/147; H01J 37/244; H01J 37/26
(Continued)

(56) References Cited

U.S. PATENT DOCUMENTS

| 5,517,033 A | 5/1996 | Krivanek et al. |
| 6,078,046 A | 6/2000 | Mori et al. |

FOREIGN PATENT DOCUMENTS

| JP | 4-269438 A | 9/1992 |
| JP | 4-355038 A | 12/1992 |

(Continued)

OTHER PUBLICATIONS

International Search Report (PCT/ISA/210) issued in PCT Application No. PCT/JP2015/059186 dated Jun. 9, 2015 with English translation (six pages).

(Continued)

*Primary Examiner* — Nicole Ippolito
*Assistant Examiner* — Hanway Chang
(74) *Attorney, Agent, or Firm* — Crowell & Moring LLP

(57) ABSTRACT

The charged particle beam device comprises: an electron gun for generating an electron beam; an imaging lens system for imaging the electron beam that has passed through a sample; a splitting portion where the electron beam that has passed through the imaging lens system is split into a first image component and a second image component; a first image detection unit for detecting the first image component and outputting a first image; a second image detection unit for detecting the second image component and outputting a second image; a processing unit; and display units. The magnification for the second image is greater than the magnification for the first image. The processing unit generates a third image by combining the first image and the second image, and the display units display the second image and the third image.

26 Claims, 7 Drawing Sheets

(51) Int. Cl.
*H01J 37/244* (2006.01)
*H01J 37/147* (2006.01)
*H01J 37/26* (2006.01)

(58) Field of Classification Search
USPC .................................................. 250/306, 307
See application file for complete search history.

(56) References Cited

FOREIGN PATENT DOCUMENTS

| JP | 5-62630 A | 3/1993 |
|----|-----------|--------|
| JP | 7-262950 A | 10/1995 |
| JP | 11-154480 A | 6/1999 |
| JP | 2002-279926 A | 9/2002 |
| JP | 2007-73211 A | 3/2007 |

OTHER PUBLICATIONS

Japanese-language Written Opinion (PCT/ISA/237) issued in PCT Application No. PCT/JP2015/059186 dated Jun. 9, 2015 (five pages).

Japanese-language International Preliminary Report on Patentability (PCT/IPEA/409) issued in PCT Application No. PCT/JP2015/059186 dated Feb. 8, 2016 with Annexes and English translation of Written Reply (18 pages).

Horiuchi, "High-Resolution Electron Microscope <Principles and Utilizations>", 1988, pages 11-12 (six total pages), Kyoritsu Shuppan Co., Ltd., with unverified English translation.

Japanese-language Office Action issued in counterpart Japanese Application No. 2017-507254 dated Jun. 5, 2018 with English translation (fourteen (14) pages).

[FIG. 1]
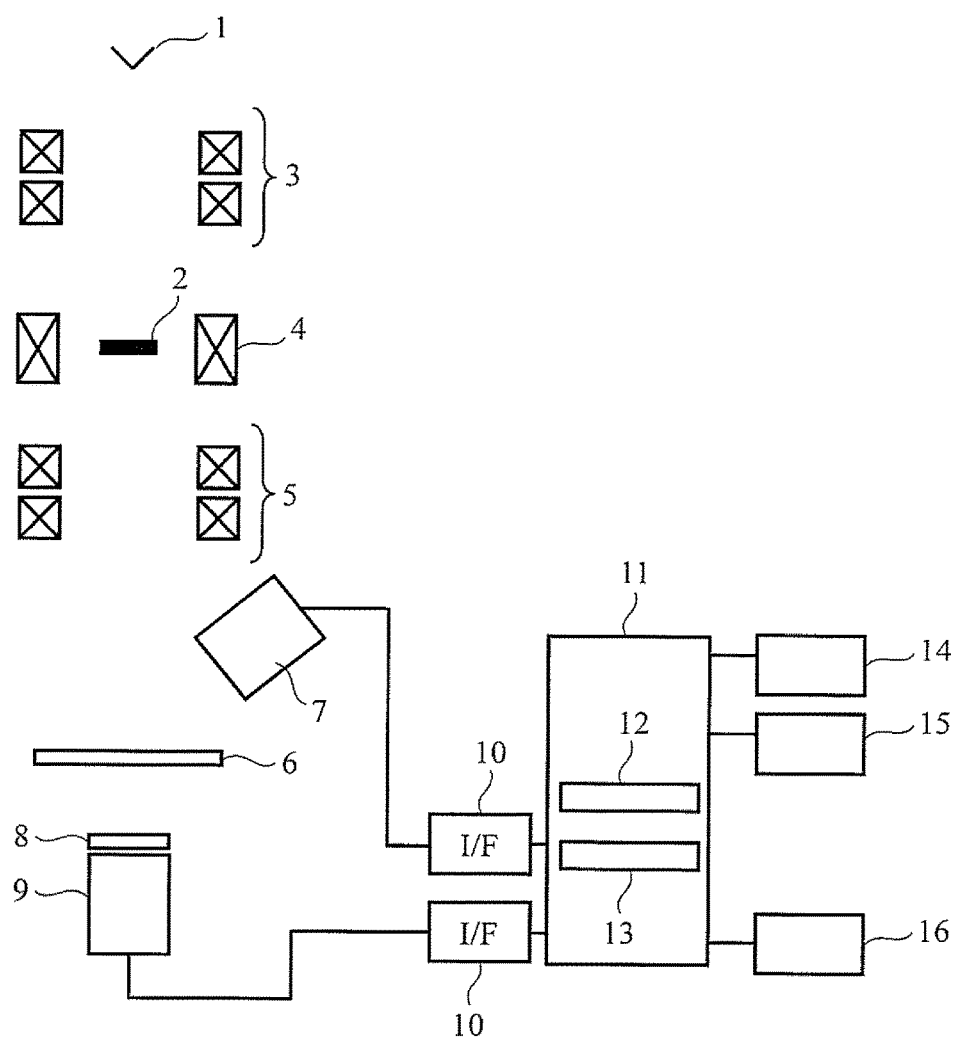

[FIG. 2]
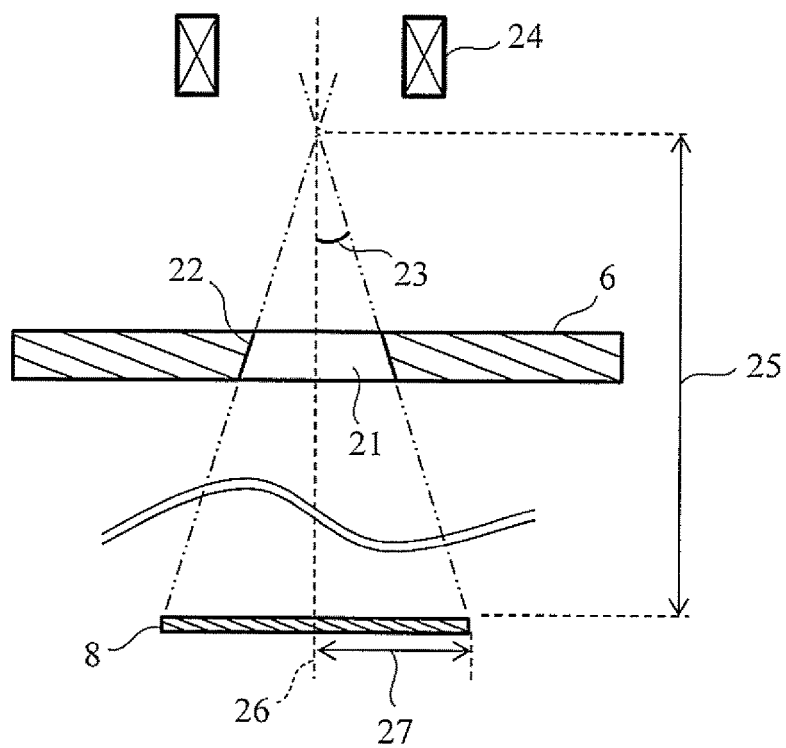
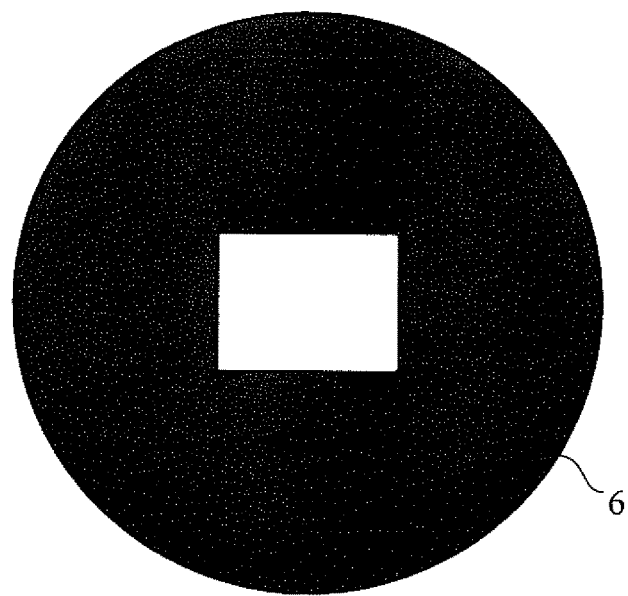

[FIG. 3]
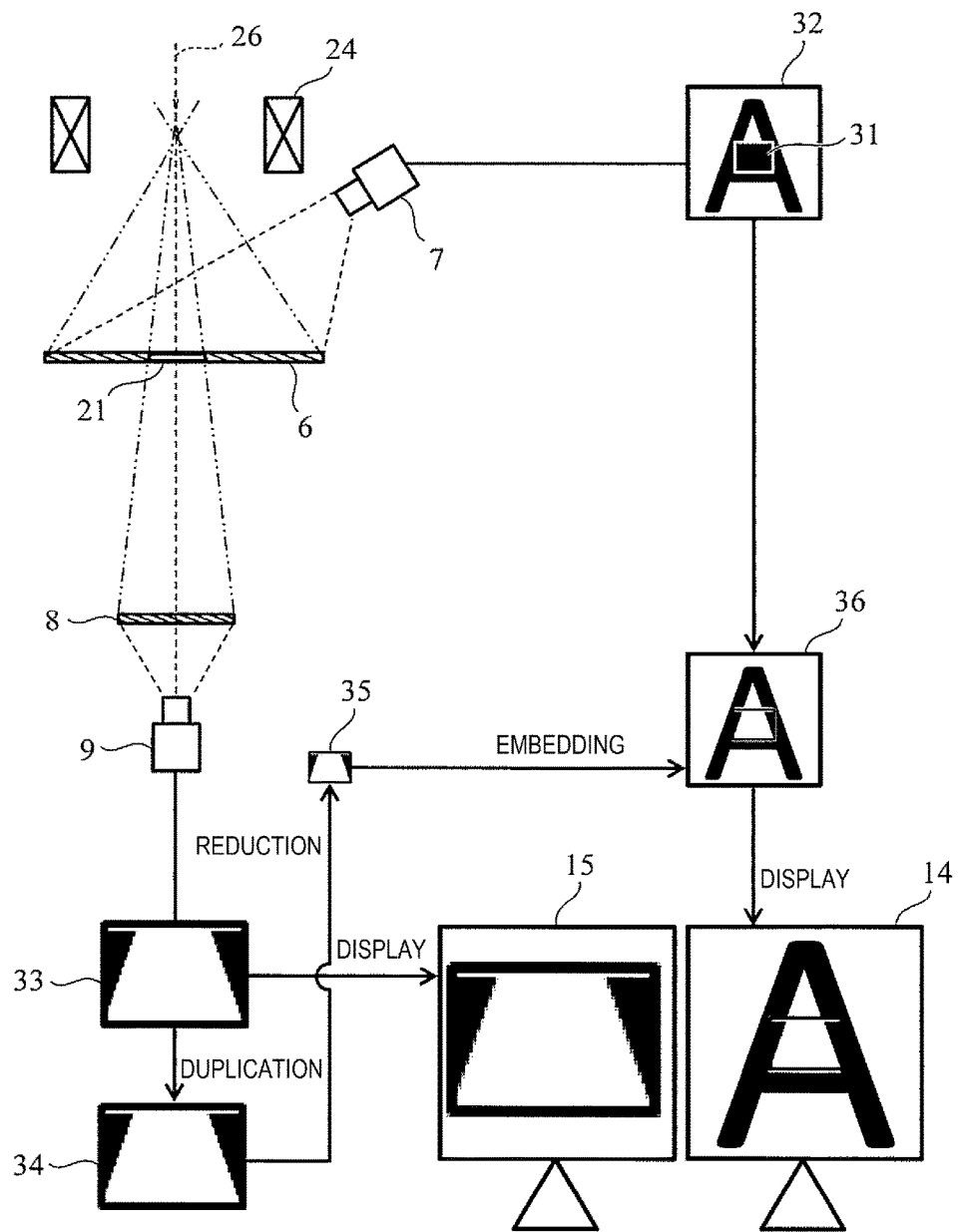

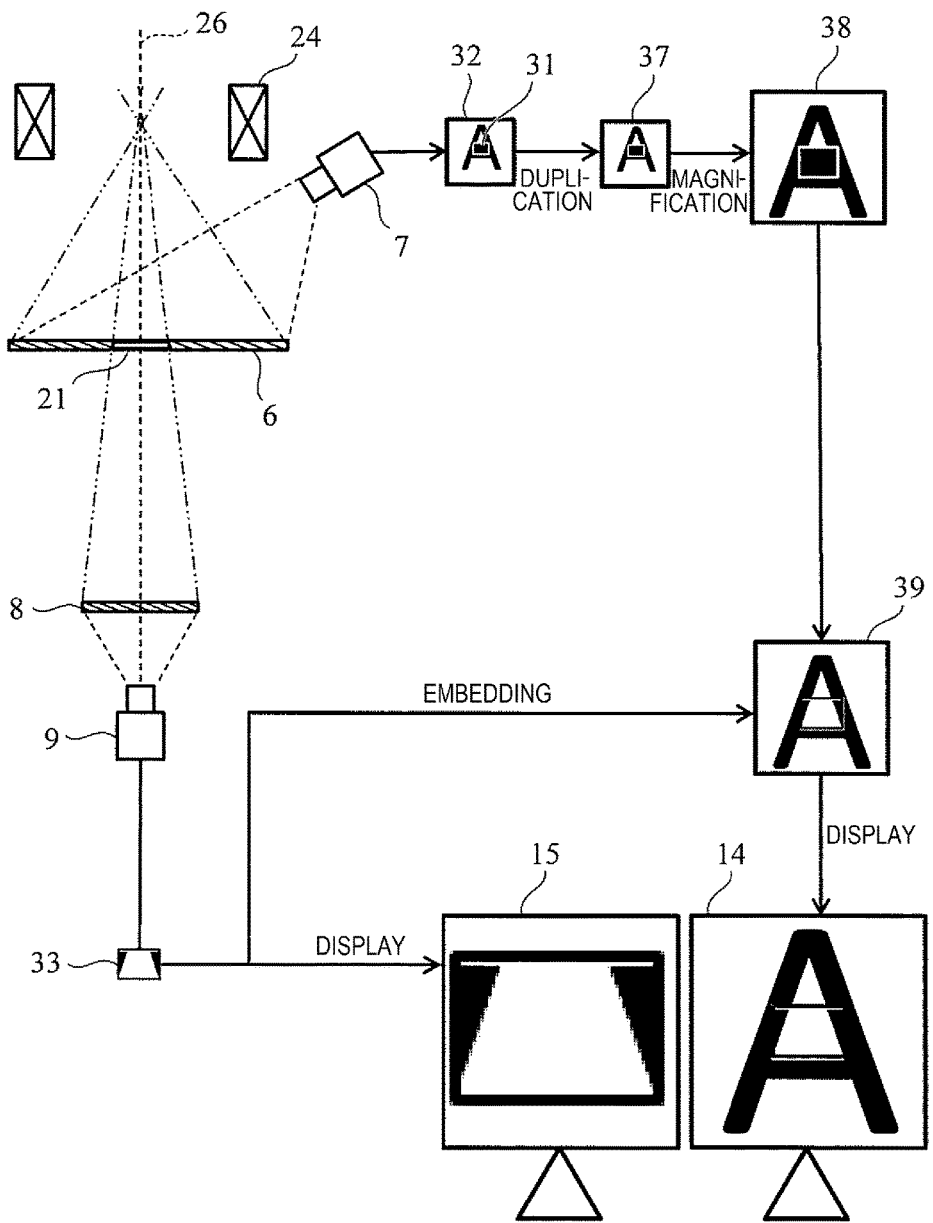

[FIG. 5]
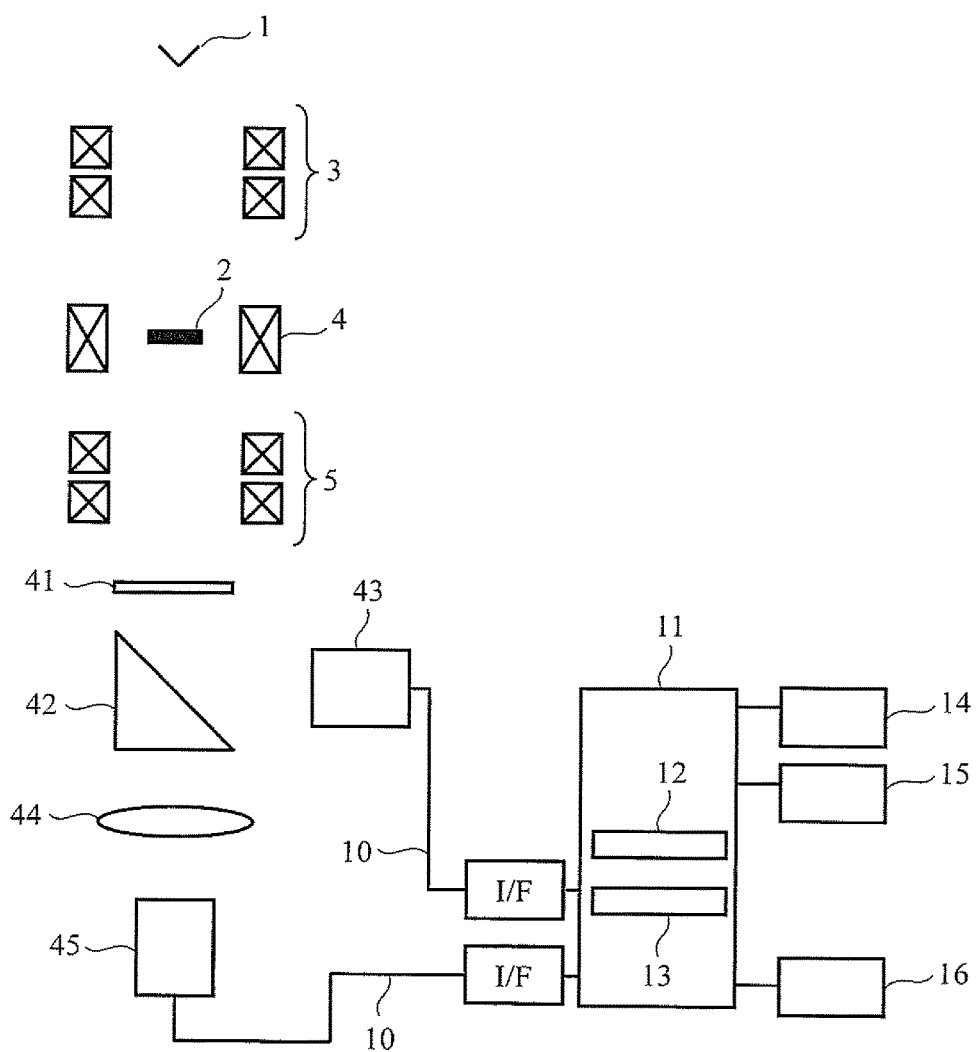

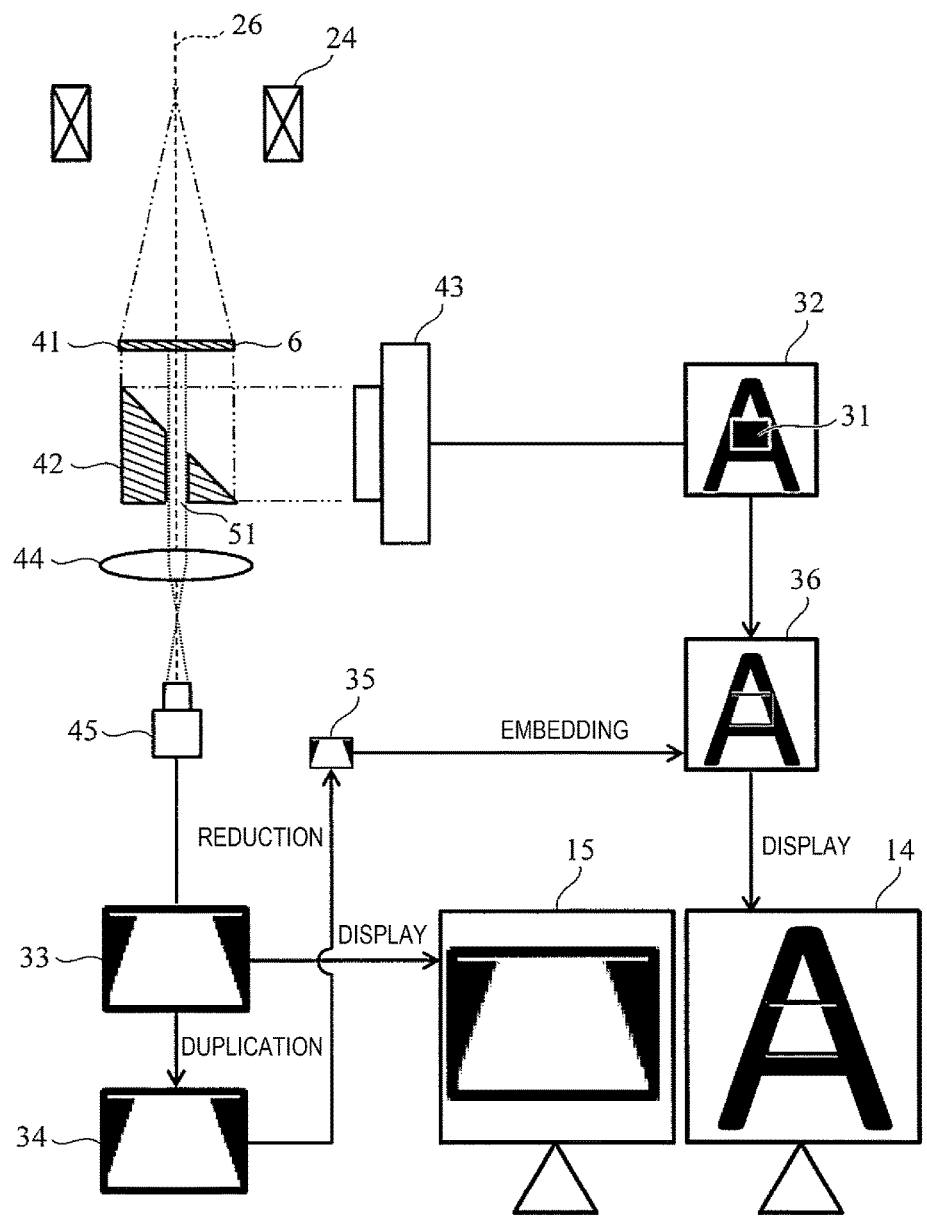
[FIG. 6]

[FIG. 7]
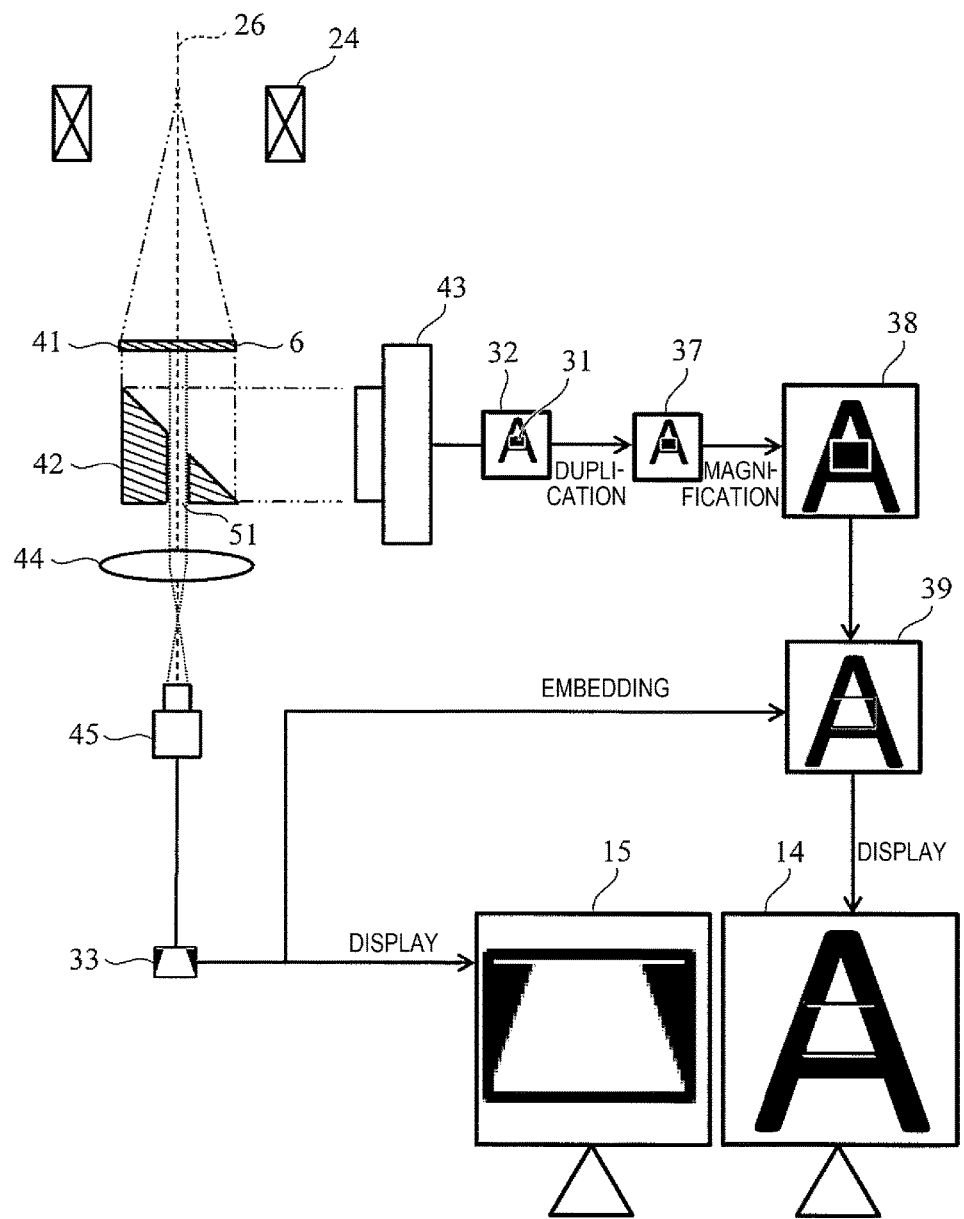

CHARGED PARTICLE BEAM DEVICE AND SAMPLE OBSERVATION METHOD IN CHARGED PARTICLE BEAM DEVICE

TECHNICAL FIELD

The present invention relates to a charged particle beam device for observing a structure of an object from charged particles passing through a sample and a sample observation method in the device.

BACKGROUND ART

In a transmission electron microscope, observation with a low magnification and a bird's eye observation are frequently used for selecting a visual field area to be observed with a high magnification. A method of performing high-magnification display of the visual field area selected by the observation with the low magnification to observe a fine structure is also used frequently.

In general, observation with a low magnification and observation with a high magnification are switched by (1) changing a magnification rate of an observation object by using an image forming lens system, or (2) by preparing plural detectors in which distances between the image forming lens system and detectors differ and by switching the detectors used for observation as shown in Non-Patent Literature 1.

Moreover, a method of simultaneously performing observation with a low magnification and observation with a high magnification by periodically changing the magnification rate of the image forming lens system to synchronize the change with a signal output cycle of a display device is also proposed as shown in Patent Literature 1.

CITATION LIST

Patent Literature

Patent Literature 1: JP-A-H04-269438

Non-Patent Literature

Non-Patent Literature 1: Horiuchi, Shigeo, High-Resolution Electron Microscope <Principles and Utilizations>, KYORITSU SHUPPAN CO., LTD. (1988), pp 11-12.

SUMMARY OF INVENTION

Technical Problem

In observation by a transmission electron microscope, a method of determining an approximate observation visual field by observation with a low magnification first, then, observing a fine structure in the observation visual field determined by switching to observation with a high magnification is common. The switching between observation with a low magnification and observation with a high magnification is generally performed several ten times per one observation object (sample). The observation has been performed by changing the magnification rate of the observation object or performed by switching detectors used for observation without changing the magnification rate of the image forming lens system in the past.

Both methods of switching the observation magnification require switching operation, which is a burden to an observer. Especially in the switching of detectors, a detector positioned at a short distance from the image forming lens system is arranged at a position where a detection signal is blocked with respect to another detector, therefore, an operation of excluding the detector from a detection signal path is necessary, which generates a certain switching time. Also in the switching method, any one of an image in a low magnification and an image of high magnification is observed, therefore, it is difficult to simultaneously observe the low-magnification image and the high magnification image in the same time instant.

In the method shown in Patent Document 1, it is almost possible to observe the low-magnification image and the high-magnification image simultaneously by synchronizing switching timing of the magnification rate of the image forming lens system with update timing of an observation image in a display device, however, there is a technical problem that update speed of the image is limited by a switching time of the magnification rate of the image forming lens system. As a magnifying lens system in the transmission electron microscope generally uses a magnetic lens, there is also a technical problem that the switching of the magnification rate causes axis misalignment and focus shift.

In view of the above, inventors provide a charged particle beam device in which not only switching operation of the observation magnification by an observer but also change in the magnification rate of the image forming lens system are not necessary as well as capable of simultaneously observing a low-magnification image and a high-magnification image in the same time instant.

Solution to Problem

As a typical invention for solving the above problems, inventors propose "a charged particle beam device including an electron gun that generates an electron beam, an imaging lens system that forms an image of the electron beam passing through a sample, a splitting unit that splits the electron beam passing through the imaging lens system into a first image component and a second image component, a first image detection unit that detects the first image component and outputs a first image, a second image detection unit that detects the second image component and outputs a second image, a processing unit and a display unit, in which a magnification of the second image is larger than a magnification of the first image, the processing unit generates a third image by composing the first image with the second image, and the display unit displays the second image and the third image.

Advantageous Effects of Invention

According to the present invention, transmission images with different magnifications can be simultaneously observed without changing the magnification ratio of the imaging lens system, and the labor required for switching observation conditions (the number of times the magnification rate is changed or the number of times the detectors are switched) can be largely reduced. Accordingly, the present invention can improve operationality of the transmission electron microscope. Problems, configurations and advantages other than the above are clarified by the following description of embodiments.

BRIEF DESCRIPTION OF DRAWINGS

FIG. 1 is a diagram showing a schematic device configuration of a transmission electron microscope according to Embodiment 1.

FIG. 2 is a diagram for explaining a cross-sectional shape and an upper surface shape of a first projection plane.

FIG. 3 is a diagram for explaining a concept of image processing according to Embodiment 1.

FIG. 4 is a diagram for explaining another concept of image processing according to Embodiment 1.

FIG. 5 is a diagram showing a schematic device configuration of a transmission electron microscope according to Embodiment 2.

FIG. 6 is a view for explaining a concept of image processing according to Embodiment 2.

FIG. 7 is a diagram for explaining another concept of image processing according to Embodiment 2.

DESCRIPTION OF EMBODIMENTS

Hereinafter, embodiments of the present invention will be explained with reference to the drawings. The embodiments of the present invention are not limited to later-described embodiments and may be variously modified within a scope of the technical concept.

(1) Embodiment 1

In the present embodiment, a transmission electron microscope capable of simultaneously executing observation with a low magnification and observation with a high magnification by simultaneously displaying an image of a first camera detecting an image projected on a first projection plane and an image of a second camera detecting an image projected on a second projection plane positioned lower than the first projection plane will be explained. The present embodiment does not limit a scope of rights.

(1-1) Device Configuration

FIG. 1 shows a schematic configuration of a transmission electron microscope used in the present embodiment. In FIG. 1, components not directly relating to explanation of the present invention such as a lens barrel are not shown. An electron beam generated from an electron gun 1 is applied to an observation object 2 through an illumination lens system 3. At this time, the electron beam is focused on the observation object 2 by an objective lens system 4. The electron beam passing through the observation object 2 is magnified or reduced by an image forming lens system 5 to form an image on a first projection plane 6. In the case of the present embodiment, a scintillator used as the first projection plane 6 has a structure in which a fluorescent material is applied to a surface of an opaque substrate. Accordingly, an image by fluorescence generated due to incidence of the electron beam is reflected on an upper part of the first projection plane 6 and detected by a first image detection unit 7.

A not-shown opening is formed on the first projection plane 6, and the electron beam passing through the opening reaches a second projection plane 8 positioned below the first projection plane 6. A scintillator used as the second projection plane 8 has a structure in which a fluorescent material is applied to a surface of a transparent substrate. Accordingly, an image by fluorescence generated due to incidence of the electron beam is acquired by a second image detection unit 9 arranged below the second projection plane 8.

Signals outputted from the first image detection unit 7 and the second image detection unit 9 are inputted to a computer 11 through signal transmission units 10. The computer 11 is provided with an operation unit 12 performing various arithmetic control processing and a storage unit 13 storing various types of data. Specific processing operations of the operation unit 12 will be described later. In the case of FIG. 1, an image acquired in the first image detection unit 7 is outputted to a first output unit (display unit) 14 and an image acquired in the second image detection unit 9 is outputted to a second output unit (display unit) 15. However, the image acquired in the first image detection unit 7 and the image acquired in the second image detection unit 9 may be composed as one display screen and outputted to one output unit (display unit). An input device 16 is used for inputting operation information with respect to the computer 11.

FIG. 2 shows a shape of the first projection plane 6. An upper side of FIG. 2 shows a cross-sectional shape of the first projection plane 6 and a lower side shows an upper surface shape of the first projection plane 6 obtained when seeing the first projection plane 6 from an incident direction of an electron beam. As shown in FIG. 2, an opening 21 is formed in the vicinity of a region crossing an optical axis in the electron beam in the first projection plane 6. A size of the opening 21 is determined so that the electron beam passing through the opening 21 corresponds to a detection range of the second image detection unit 9. An opening side surface 22 prescribing an outer edge of the opening 21 is tilted by an angle 23 (θ) with respect to the optical axis of the electron beam. Specifically, opening side surface 22 is processed into a tapered shape so that an opening diameter on an upper surface side (incident side of the electron beam) is smaller than an opening diameter of an undersurface side (second projection plane 8 side). In other words, it is formed so that extended lines of the opening side surface 22 cross the optical axis of the electron beam above the first projection plane 6.

The angle θ can be derived by using a distance 25 (L) from a focal position of a lens 24 positioned in the lowest stage of the imaging lens system 5 to the second projection plane 8, a distance 27 (X) from an optical axis 26 to an end surface of the detection range of the second image detection unit 9 and the following formula. In this case, a distance from the optical axis 26 to an end surface of the second projection plane 8 is assumed to be the same as the distance 27 (X) from the optical axis 26 to the end surface of the detection range of the second image detection unit 9.

$$\text{angle}\,\theta = \tan\frac{X}{L} \qquad \text{(formula 1)}$$

As the tilt of the angle θ is formed in the opening side surface 22 of the opening 21 provided in the scintillator used as the first projection plane 6, the electron beam incident on the opening 21 can be projected on the second projection plane 8 appropriately. Here, a non-photosensitive material with respect to the electron beam is used for the opening side surface 22, thereby preventing transmission of unnecessary signals (fluorescence) to the first image detection unit 7 and the second mage detection unit 9.

(1-2) Processing Operations

Processing operations executed by the transmission electron microscope having the configuration shown in FIG. 1 will be explained with reference to FIG. 3.

As described above, the opening 21 having the size corresponding to the detection range of the second image detection unit 9 is formed in the first projection plane 6 used in the present embodiment. Therefore, in the first image detection unit 7, fluorescence is not incident on a pixel region 31 corresponding to the opening 21. Accordingly, a density value at a portion corresponding to the pixel region 31 in a first image 32 outputted from the first image detection unit 7 is extremely low. In the specification, the portion where the density value is extremely low is also referred to as a "cut portion". As the first image 32 is an image obtained by observing the first projection plane 6 from an obliquely upward direction, a distortion actually exists in the image. An image obtained after the distortion is removed by the operation unit 12 is shown as the first image 32. Incidentally, the first image 32 corresponds to an image by low-magnification observation.

On the other hand, the electron beam incident on the opening 21 of the first projection plane 6 is directly projected on the second projection plane 8 to be converted into an image corresponding to an intensity value of fluorescence. At this time, a focal length of an image formed on the second projection plane 8 is longer than a focal length of an image formed on the first projection plane 6 as shown in FIG. 3. Accordingly, a second image 33 with a higher magnification than the first image 32 is outputted from the second image detection unit 9 at the same time as the first image 32. That is, the first image 32 and the second image 33 with different observation magnifications are simultaneously obtained.

The operation unit 12 duplicates the second image 33 on the storage unit 13 and creates a duplicated image 34. Subsequently, the operation unit 12 reduces an image size of the duplicated image 34 in accordance with a calculated magnification. A size of an image 35 obtained by reducing the duplicated image 34 corresponds to the size of the pixel region 31 corresponding to the opening 21. The operation unit 12 embeds the reduced image 35 in the cut portion (the pixel region 31 corresponding to the opening) of the first image 32 to create a composite image 36.

After that, the operation unit 12 displays the composite image 36 (composite image of the image 35 obtained by reducing the second image 33 and the first image 32) on the first output unit 14 and displays the second image 33 on the second output unit 15. When these processing is performed in synchronization with signal output cycles of the first image detection unit 7 and the second image detection unit 9, the observer can observe the low-magnification image projected on the first projection plane 6 and the high-magnification image projected on the second projection plane 8 at the same time.

In the present embodiment, respective parameters of the first and second projection planes 6 and 8 as well as the first and second image detection units 7 and 9 are defined as shown in Table 1.

TABLE 1

| Items | Parameters concerning first projection plane, first image detection unit and first output unit | Parameters concerning second projection plane, second image detection unit and second output unit |
|---|---|---|
| Pixel size of image detection unit | $P_1$ | $P_2$ |
| Pixel number of image detection unit | $N_1$ | $N_2$ |
| Pixel number of display unit | $V_1$ | $V_2$ |
| Distance from imaging lens object plane to same lens principal surface | A | |
| Distance from imaging lens principal plane to projection plane | $L_1$ | $L_2$ |

In this case, a magnification ratio of images displayed on the first output unit 14 and the second output unit 15 can be represented by the following formula.

$$\text{magnification ratio} = \frac{\text{magnification of second output unit}}{\text{magnification of first output unit}} = \frac{N_1 V_2 L_2}{N_2 V_1 L_1} \quad \text{(formula 2)}$$

A magnification calculated in the operation unit 12 can be represented by the following formula.

$$\text{magnification} = \frac{P_2 L_1}{P_1 L_2} \quad \text{(formula 3)}$$

(1-3) Summary

As described above, when using the transmission electron microscope according to the embodiment, the low-magnification observation and the high-magnification observation can be simultaneously performed. Moreover, as it is not necessary to switch observation conditions in the case of the present embodiment, the number of times the magnification rate is changed or the number of times the detectors are switched, which can largely improve operationality of the transmission microscope. In particular, high effect can be expected in application to a field of cell form observation in which the bird's eye observation and observation of the fine structure are repeated. Furthermore, as images with different magnifications can be simultaneously acquired in the present embodiment as described above, it is suitable for observation of the observation object 2 the shape and the state of which temporally vary.

(1-4) Modification Example 1

The image 35 obtained by reducing the second image 33 after duplication is embedded in the first image 32 to generate the composite image 36 in the embodiment, and it is also realize simultaneous observation of images with different magnifications by directly outputting the first image 32 to the first output unit 14 and outputting the image 35 obtained by reducing the second image 33 corresponding to the high-magnification image to the second output unit 15.

(1-5) Modification Example 2

The image projected on the first projection plane 6 is detected by the first image detection unit 7 in the embodiment, and it is also preferable that an image projected on the first projection plane 6 through a mirror is guided to the first image detection unit 7 to be detected.

(1-6) Modification Example 3

The composite image 36 is created without performing contrast adjustment in the embodiment, and it is also preferable to create the composite image 36 by calculating an average value of differences or ratios of density values of pixels positioned at a boundary between the image 35 obtained by reducing the second image 33 after duplication and the first image 32 in the operation unit 12, and then, by adjusting the contrast of the first image 33 and/or the image 35 by using the average value. It is possible to reduce a feeling of strangeness with respect to the composite image 36 occurring when the contrast at a boundary portion is high according to the installation of such processing function.

(1-7) Modification Example 4

The composite image 36 is created without performing processing to the boundary portion between the first image 32 and the image 35 obtained by reducing the second image 33 after duplication in the present embodiment, and it is also preferable to create the composite image 36 in which the boundary between the first image 32 and the image 35 is clearly shown with a frame by the operation unit 12.

(1-8) Modification Example 5

The second image 33 is acquired from an undersurface side of the second projection plane 8 in the embodiment, and it is also preferable that the scintillator used as the second projection plane 8 has a structure in which a fluorescent material is applied to a surface of an opaque substrate to thereby acquire a projection image from an upper side of the second projection plane.

(1-9) Modification Example 6

The image 35 obtained by reducing the second image 33 is embedded in the first image 32 in the present embodiment, and it is also preferable that the second image 33 is embedded in an image 38 obtained by magnifying a duplicated image 37 of the first image 32 as shown in FIG. 4.

(2) Embodiment 2

Another method for simultaneously acquiring two images with different observation magnifications will be explained in the present embodiment. Here, an embodiment using only one projection plane will be explained. Specifically, a transmission electron microscope capable of simultaneously executing observation with a low magnification and observation with a high magnification by simultaneously displaying an image of a first camera that detects the entire image projected on the projection plane and an image of a second camera that magnifies and detects part of the image projected on the projection plane will be explained. The present embodiment does not limit a scope of rights.

(2-1) Device Configuration

FIG. 5 shows a schematic configuration of a transmission electron microscope used in the present embodiment. In FIG. 5, the same symbols are given to corresponding portions of FIG. 1. Explanation for portions to which the same symbols are given is omitted. Points different from Embodiment 1 are a projection plane 41, a mirror 42, a first image detection unit 43, a magnifying lens 44 and a second image detection unit 45.

In the case of the present invention, a scintillator in which a fluorescent material is applied to the entire surface of a transparent substrate is used as the projection plane 41. As the projection plane 41 is transparent, an image by fluorescence generated by incident of the electron beam passes through the projection plane 41 and reaches the mirror 42. The image is separated into one part and the other part by the mirror 42. An opening is formed in the mirror 42 according to the embodiment as described later, and the image is separated into a fluorescent image passing through the opening and the other fluorescent image.

The fluorescent image reflected on the mirror 42 is detected by the first image detection unit 43 and outputted as a first image. The image passing through the opening of the mirror 42 is magnified by the magnifying lens 44 and formed on an imaging plane of the second image detection unit 45. The second image detection unit 45 outputs the detected image as a second image.

(2-2) Processing Operations

Processing operations executed by the transmission electron microscope having the configuration shown in FIG. 5 will be explained with reference to FIG. 6. FIG. 6 is shown by giving the same symbols to portions corresponding to FIG. 3 and FIG. 5.

As described above, an opening 51 is formed at a portion corresponding to the detection range of the second image detection unit 9 in the mirror 42 used in the present embodiment. A size of the opening is determined in the same manner as the opening 21 of Embodiment 1. An image reflected on the mirror 42 is projected by the first image detection unit 43. An image passing through the opening 51 is projected by the second image detection unit 45 after being magnified by the magnifying lens 44. The contents of image processing with respect to signals outputted form the first and second image detection units 43 and 45 are the same as Embodiment 1.

In the present embodiment, respective parameters of the magnifying lens 44, the first and second image detection units 43 and 45 are defined as shown in Table 2.

TABLE 2

| Items | Parameters concerning first image detection unit and first output unit | Parameters concerning second image detection unit and second output unit |
|---|---|---|
| Pixel size of image detection unit | $P_1$ | $P_2$ |
| Pixel number of image detection unit | $N_1$ | $N_2$ |
| Pixel number of display unit | $V_1$ | $V_2$ |
| Magnification rate of lens | — | $M_2$ |

In this case, a magnification ratio of images displayed on the first output unit 14 and the second output unit 15 can be represented by the following formula.

$$\text{magnification ratio} = \frac{\text{magnification of second output unit}}{\text{magnification of first output unit}} = \frac{N_1 V_2 M_2}{N_2 V_1} \quad \text{(formula 4)}$$

A magnification calculated in the operation unit 12 can be represented by the following formula.

$$\text{magnification} = \frac{P_2}{P_1 M_2} \quad \text{(formula 5)}$$

(2-3) Summary

The same advantages as the transmission electron microscope according to Embodiment 1 can be realized also when using the transmission electron microscope according to the embodiment.

(2-4) Modification Example 1

The image 35 obtained by reducing the second image 33 after duplication is embedded in the first image 32 to generate the composite image 36 also in the embodiment, and it is also possible to realize simultaneous observation of images with different observation magnifications by directly outputting the first image 32 to the first output unit 14 and outputting the image 35 obtained by reducing the second image 33 corresponding to the high-magnification image to the second output unit 15.

(2-5) Modification Example 2

The composite image 36 is created without performing contrast adjustment also in the embodiment, and it is also preferable to create the composite image 36 by calculating an average value of differences or ratios of density values of pixels positioned at a boundary between the image 35 obtained by reducing the second image 33 after duplication and the first image 32 in the operation unit 12, and then, by adjusting the contrast of the first image 33 and/or the image 35 by using the average value. It is possible to reduce a feeling of strangeness with respect to the composite image 36 occurring when the contrast at a boundary portion is high according to the installation of such processing function.

(2-6) Modification Example 3

The composite image 36 is created without performing processing to the boundary portion between the first image 32 and the image 35 obtained by reducing the second image 33 after duplication also in the present embodiment, and it is also preferable to create the composite image 36 in which the boundary between the first image 32 and the image 35 is clearly shown with a frame by the operation unit 12.

(2-7) Modification Example 4

The mirror 42 with the opening 51 is used in the present embodiment, and the above advantages can be obtained also by using a half mirror or a beam splitter instead of the mirror 42.

(2-8) Modification Example 5

The image 35 obtained by reducing the second image 33 is embedded in the first image 32 in the present embodiment, and it is also preferable that the second image 33 is embedded in an image 38 obtained by magnifying a duplicated image 37 of the first image 32 as shown in FIG. 7.

(3) Other Embodiments

The present invention is not limited to the above embodiments and various modification examples are included. The above embodiments have been explained in detail for explaining the present invention easily to understand, and it is not always necessary that embodiments include all explained components. Though the transmission electron microscope has been explained in the above embodiments, the present invention can be applied to, for example, microscope equipment using charged particles (for example, ions) other than electrons. It is also possible to replace part of components in a certain embodiment with components of another embodiment. It is also possible to add components of other embodiments to components of a certain embodiment. It is further possible to add, delete or displace part of components of other embodiments with respect to part of components of respective embodiments.

Part or all of the above respective components, functions, processing units, processing means and so on may be realized by hardware by being designed by, for example, an integrated circuit. The above components, the functions and so on may be realized by interpreting and executing programs that realize respective functions by a processor (namely, in a software manner). Information such as programs, tables and files for realizing respective functions may be stored in storage units such as a memory, a hard disk and a SSD (solid state device) or storage media such as an IC card, a SD card and a DVD. Control lines and information lines that are considered to be necessary for explanation are shown, which do not represent all necessary control lines and information lines as a product. It can be considered that almost all components are actually connected to one another.

REFERENCE SIGNS LIST

1: electron gun
2: observation object
3: illumination lens system
4: objective lens system
5: imaging lens system
6: first projection plane
7: first image detection unit
8: second projection plane
9: second image detection unit
10: signal transmission unit
11: computer
12: operation unit
13: storage unit
14: first output unit (display unit)
15: second output unit (display unit)
16: input device
21: opening
22: opening side surface
23: angle θ
24: lens positioned in the lowest stage of imaging lens system
25: distance L
26: optical axis
27: distance X
31: pixel region corresponding to opening
32: first image
33: second image
34: duplicated image of second image
35: reduced image
36: composite image
37: duplicated image
38: magnified image
39: composite image
41: projection plane
42: mirror
43: first image detection unit
44: magnifying lens
45: second image detection unit
51: opening.

The invention claimed is:

1. A charged particle beam device comprising:
an electron gun that generates an electron beam;
an imaging lens system that forms an image of the electron beam passing through a sample;
a splitting unit that splits the electron beam passing through the imaging lens system into a first image component and a second image component;
a first image detection unit that detects the first image component and outputs a first image;
a second image detection unit that detects the second image component and outputs a second image;
a processing unit; and
a display unit,
wherein a magnification of the second image is larger than a magnification of the first image,
the processing unit generates a third image by composing the first image with the second image, and
the display unit displays the second image and the third image.

2. The charged particle beam device according to claim 1, wherein the processing unit generates the third image by reducing the second image and embeds the reduced image in the first image.

3. The charged particle beam device according to claim 2, wherein the display unit performs display by forming a frame at a boundary between the reduced image and the first image.

4. The charged particle beam device according to claim 2, wherein the processing unit changes a contrast in the vicinity of a boundary between the reduced image and the first image to a predetermined value.

5. The charged particle beam device according to claim 4, wherein the splitting unit is a first scintillator in which an opening is formed,
the first image component is light from the first scintillator,
a second scintillator for detecting the electron beam passing through the opening is further included, and
the second image component is light from the second scintillator.

6. The charged particle beam device according to claim 5, wherein an end surface that prescribes the opening in a cross section of the first scintillator is tilted so that extended lines of the end surface cross an optical axis of the electron beam above the scintillator.

7. The charged particle beam device according to claim 6, wherein the end surface is not photosensitive with respect to the electron beam.

8. The charged particle beam device according to claim 1, wherein the processing unit generates the third image by changing a contrast in the vicinity of a boundary between the first image and the second image to a predetermined value.

9. The charged particle beam device according to claim 1, wherein the splitting unit is a first scintillator in which an opening is formed,
the first image component is light from the first scintillator,
a second scintillator for detecting the electron beam passing through the opening is further included, and
the second image component is light from the second scintillator.

10. The charged particle beam device according to claim 9, wherein an end surface that prescribes the opening in a cross section of the first scintillator is tilted so that extended lines of the end surface cross an optical axis of the electron beam above the scintillator.

11. The charged particle beam device according to claim 9, wherein the end surface that prescribes the opening in the cross section of the first scintillator is not photosensitive with respect to the electron beam.

12. The charged particle beam device according to claim 1, wherein the processing unit generates the third image by magnifying the first image and embeds the second image in the magnified image.

13. The charged particle beam device according to claim 1, wherein the third image is created after calculating an average value of differences or ratios of density values of pixels positioned at a boundary between a fourth image obtained by reducing the second image after duplication and the first image and adjusting the contrast of the first image and/or the fourth image by using the average value.

14. The charged particle beam device according to claim 1, wherein a scintillator in which a fluorescent material is applied to a surface of an opaque substrate is used as a projection plane of the second image component, and the second image detection unit detects the second image component from an upper side of the scintillator to output the second image.

15. A charged particle beam device comprising:
an electron gun that generates an electron beam;
an imaging lens system that forms an image of the electron beam passing through a sample;
a mirror in which an opening is formed, which splits the electron beam passing through the imaging lens system into a first image component reflected on the mirror and a second image component passing through the opening;
a first image detection unit that detects the first image component and outputs a first image;
a second image detection unit that detects the second image component and outputs a second image;
a processing unit; and
a display unit,
wherein a magnification of the second image is larger than a magnification of the first image,
the processing unit generates a third image by composing the first image with the second image, and
the display unit displays the second image and the third image.

16. The charged particle beam device according to claim 15, wherein the third image is created after calculating an average value of differences or ratios of density values of pixels positioned at a boundary between a fourth image obtained by reducing the second image after duplication and the first image and adjusting the contrast of the first image and/or the fourth image by using the average value.

17. The charged particle beam device according to claim 15, wherein a scintillator in which a fluorescent material is applied to a surface of an opaque substrate is used as a projection plane of the second image component, and the second image detection unit detects the second image component from an upper side of the scintillator to output the second image.

18. A charged particle beam device comprising:
an electron gun that generates an electron beam;
an imaging lens system that forms an image of the electron beam passing through a sample;
a half mirror or a beam splitter that splits the electron beam passing through the imaging lens system into a first image component as reflected light and a second image component as transmission light;
a first image detection unit that detects the first image component and outputs a first image;
a second image detection unit that detects the second image component and outputs a second image;
a processing unit; and
a display unit,
wherein a magnification of the second image is larger than a magnification of the first image,
the processing unit generates a third image by composing the first image with the second image, and
the display unit displays the second image and the third image.

19. The charged particle beam device according to claim 18, wherein the third image is created after calculating an average value of differences or ratios of density values of pixels positioned at a boundary between a fourth image obtained by reducing the second image after duplication and the first image and adjusting the contrast of the first image and/or the fourth image by using the average value.

20. The charged particle beam device according to claim 18,
wherein a scintillator in which a fluorescent material is applied to a surface of an opaque substrate is used as a projection plane of the second image component, and
the second image detection unit detects the second image component from an upper side of the scintillator to output the second image.

21. A sample observation method in a charged particle beam device including an electron gun that generates an electron beam, an imaging lens system that forms an image of the electron beam passing through a sample, a splitting unit that splits the electron beam passing through the imaging lens system into a first image component and a second image component, a first image detection unit that detects the first image component and outputs a first image, a second image detection unit that detects the second image component and outputs a second image, a processing unit and a display unit, the method comprising the steps of:
in a case where a magnification of the second image is larger than a magnification of the first image,
generating a third image by composing the first image with the second image by the processing unit; and
displaying the second image and the third image on the display unit.

22. The sample observation method in the charged particle beam device according to claim 21,
wherein the processing unit generates the third image by reducing the second image and embeds the reduced image in the first image.

23. The sample observation method in the charged particle beam device according to claim 22,
wherein the display unit output an image by forming a frame at a boundary between the reduced image and the first image.

24. The sample observation method in the charged particle beam device according to claim 22,
wherein the processing unit changes a contrast in the vicinity of a boundary between the reduced image and the first image to a predetermined value.

25. The sample observation method in the charged particle beam device according to claim 21,
wherein the third image is created after calculating an average value of differences or ratios of density values of pixels positioned at a boundary between a fourth image obtained by reducing the second image after duplication and the first image and adjusting the contrast of the first image and/or the fourth image by using the average value.

26. The sample observation method in the charged particle beam device according to claim 21,
wherein the second image detection unit detects the second image component projected on a scintillator in which a fluorescent material is applied to a surface of an opaque substrate from an upper side of the scintillator to output the second image.

* * * * *